(12) United States Patent
Otremba

(10) Patent No.: US 8,513,798 B2
(45) Date of Patent: Aug. 20, 2013

(54) POWER SEMICONDUCTOR CHIP PACKAGE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 282 days.

(21) Appl. No.: 12/878,289

(22) Filed: Sep. 9, 2010

(65) Prior Publication Data
US 2012/0061812 A1 Mar. 15, 2012

(51) Int. Cl.
*H01L 23/52* (2006.01)

(52) U.S. Cl.
USPC .......................................... 257/691; 257/787

(58) Field of Classification Search
USPC ........... 257/691, 701, 787, E29.257, E21.418
See application file for complete search history.

(56) References Cited

U.S. PATENT DOCUMENTS

| | | | |
|---|---|---|---|
| 5,272,105 A * | 12/1993 | Yacobi et al. | 438/412 |
| 2003/0022464 A1* | 1/2003 | Hirano et al. | 438/460 |
| 2005/0029666 A1 | 2/2005 | Kurihara et al. | |
| 2006/0228901 A1* | 10/2006 | Yoon et al. | 438/775 |
| 2007/0166877 A1 | 7/2007 | Otremba | |
| 2008/0093619 A1* | 4/2008 | Konno et al. | 257/98 |
| 2010/0051963 A1 | 3/2010 | Otremba | |

* cited by examiner

*Primary Examiner* — Sheila V. Clark
(74) *Attorney, Agent, or Firm* — Slater & Matsil, L.L.P.

(57) ABSTRACT

A device includes a vertical power semiconductor chip having an epitaxial layer and a bulk semiconductor layer. A first contact pad is arranged on a first main face of the power semiconductor chip and a second contact pad is arranged on a second main face of the power semiconductor chip opposite to the first main face. The device further comprises an electrically conducting carrier attached to the second contact pad.

18 Claims, 7 Drawing Sheets

POWER SEMICONDUCTOR CHIP PACKAGE

TECHNICAL FIELD

The invention generally relates to semiconductor chip packaging and more particularly to packaging of a power semiconductor chip.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical impacts to ensure reliability and performance. Packaging semiconductor chips increases the cost and complexity of manufacturing semiconductor devices because the packaging designs shall not only provide protection, they shall also permit transmission of electrical signals to and from the semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
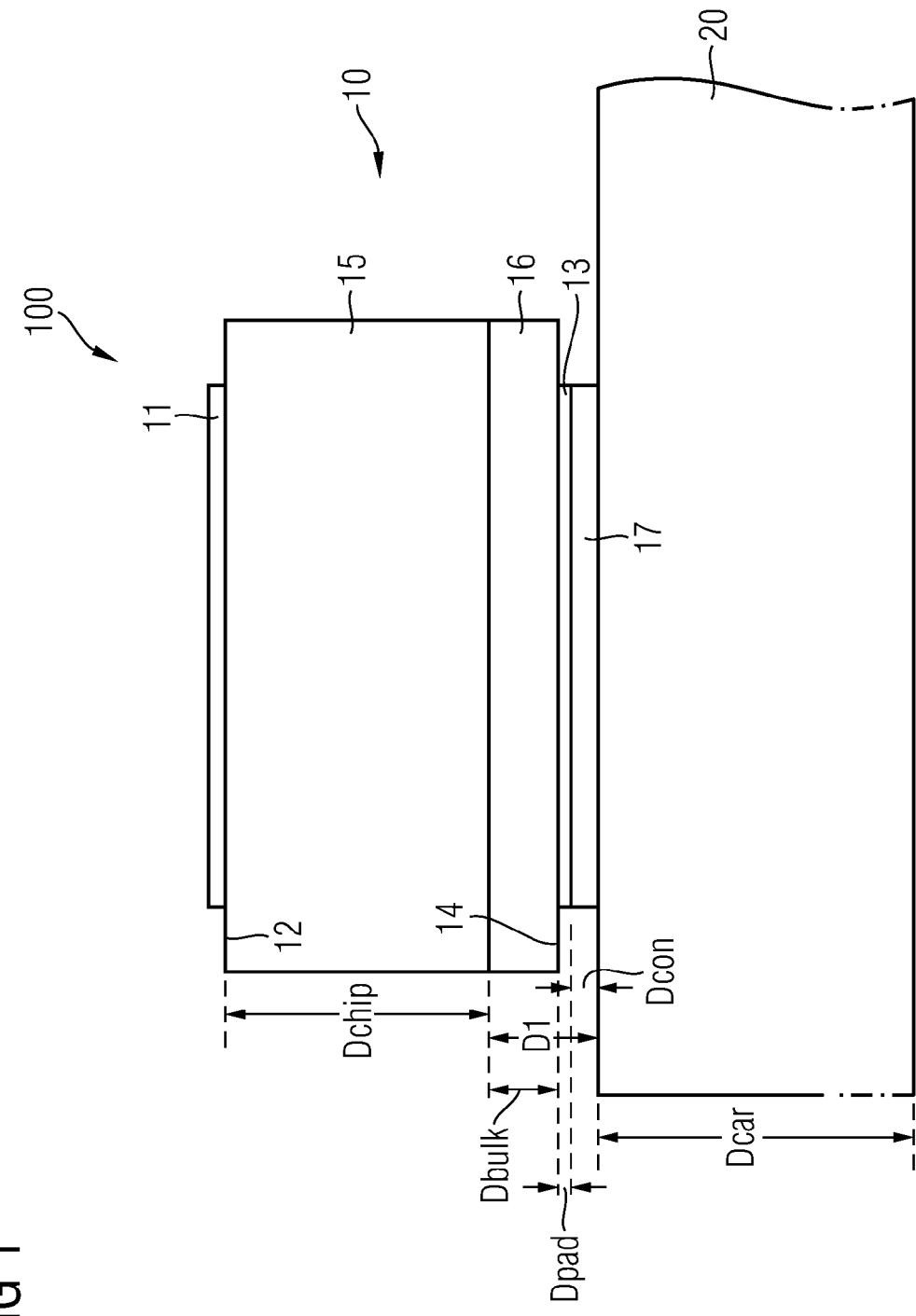
FIG. 1 is a cross-sectional view of one embodiment of a semiconductor device including a power semiconductor chip mounted on an electrically conducting carrier.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together—intervening elements may be provided between the "coupled" or "electrically coupled" elements.

Devices containing power semiconductor chips are described below. The power semiconductor chips may be of different types, may be manufactured by different technologies and may include, for example, integrated electrical, electro-optical or electro-mechanical circuits or passives. The power semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals. Furthermore, the devices described below may include further integrated circuits to control the power integrated circuits of the power semiconductor chips.

The power semiconductor chips may comprise power MOSFETs (Metal Oxide Semiconductor Field Effect Transistors), IGBTs (Insulated Gate Bipolar Transistors), JFETs (Junction Gate Field Effect Transistors), power bipolar transistors or power diodes. More specifically, power semiconductor chips having a vertical structure are involved, that is to say that the power semiconductor chips are fabricated in such a way that electric currents can flow in a direction perpendicular to the main faces of the power semiconductor chips.

A power semiconductor chip having a vertical structure may have contact pads on its two main faces, that is to say on its top side and bottom side. By way of example, the source electrode and the gate electrode of a power MOSFET may be situated on one main face, while the drain electrode of the power MOSFET may be arranged on the other main face. The contact pads may be made of aluminum, copper or any other suitable material. One or more metal layers may be applied to the contact pads of the power semiconductor chips. The metal layers may, for example, be made of titanium, nickel vanadium, gold, silver, copper, palladium, platinum, nickel, chromium or any other suitable material. The metal layers need not be homogenous or manufactured from just one material, that is to say various compositions and concentrations of the materials contained in the metal layers are possible.

The power semiconductor chip may be made of a bulk semiconductor layer and an epitaxial layer generated on the bulk semiconductor layer. The epitaxial layer may have a thickness greater than the thickness of the bulk semiconductor layer. In particular, the epitaxial layer may have a thickness of equal or greater than 20 µm, 30 µm, 40 µm or 50 µm. Typically, the greater the thickness of the epitaxial layer, the higher is the operating voltage of the power semiconductor chip. The bulk semiconductor layer may have a thickness of equal or less than 30 µm, 20 µm or 15 µm.

An electrically conducting carrier may be applied to the power semiconductor chip. The electrically conducting carrier may significantly affect the electrical properties of the power semiconductor chip by mechanical interaction with the power semiconductor chip. The carrier may be a leadframe, i.e., a structured metal sheet. The leadframe may have a thickness equal or greater than 1.0 mm, 1.5 mm or 2.0 mm in order to exert mechanical stress on the power semiconductor chip.

An encapsulation material may at least partially cover the power semiconductor chip to form an encapsulation body. The encapsulation material may be based on a polymer material, that is it may include a basis material (also referred to as a matrix material in the following) made of any appropriate duroplastic, thermoplastic or thermosetting material or laminate (prepreg). In particular, a matrix material based on epoxy resin may be used. The matrix material may embed a filler material, for instance $SiO_2$, $Al_2O_3$ or AlN particles to adjust physical properties of the encapsulation body such as, e.g., the elastic modulus or the CTE (coefficient of thermal expansion).

After its deposition, the encapsulation material may only be partially hardened and may then be cured and/or completely hardened by the application of energy (e.g., heat, UV light, etc.) to form the solid encapsulation body. Various techniques may be employed to form the encapsulation body by the encapsulation material, for example, compression molding, transfer molding, injection molding, powder molding, liquid molding, dispensing or laminating. Heat and/or pressure may be used to apply the encapsulation material.

The encapsulation body may be designed to significantly affect the electrical properties of the power semiconductor chip by mechanical interaction with the power semiconductor chip. The encapsulation body may have an elastic modulus of equal or greater than 50,000 MPa and/or a chip covering thickness (i.e., thickness over an upper surface of the power semiconductor chip) great enough to satisfy the condition that the ratio of the chip covering thickness and a sum of the thickness of the power semiconductor chip, the thickness of the connecting layer and the thickness of the electrically conducting carrier is equal or greater than 3 in order to exert a compression or downward pressure on the power semiconductor chip.

FIG. 1 schematically illustrates a power device 100 in cross section. The device 100 includes a power semiconductor chip 10. The power semiconductor chip 10 has one or more first contact pads 11 that are arranged on a first main face 12 of the power semiconductor chip 10 and has one or more second contact pads 13 that are arranged on a second main face 14 of the power semiconductor chip 10 opposite to the first main face 12. Further, the power device 100 comprises a carrier 20 on which the power semiconductor chip 10 is mounted.

The power semiconductor chip 10 is a vertical device, i.e., electric currents can flow in a direction perpendicular to the main faces 12, 14 of the power semiconductor chip 10. In one embodiment, the power semiconductor chip 10 is a power transistor and the first contact pad(s) 11 may form a source terminal and the second contact pad(s) 13 may form a drain terminal. In this embodiment, typically, a gate terminal (not shown) is arranged on the first main face 12 of the power semiconductor chip 10. In other embodiments, the power semiconductor chip 10 may be a power diode, and the first contact pad(s) 11 may, e.g., form an anode terminal whilst the second contact pad(s) 13 may form a cathode terminal of the power diode or vice versa.

More specifically, the power semiconductor chip 10 may comprise an epitaxial layer 15 arranged, e.g., on a bulk semiconductor layer 16. A person skilled in the art is well aware of multiple semiconductor processing techniques to produce such a structure. Briefly, the power semiconductor chips 10 may be fabricated on a wafer made of semiconductor material. The upper surface of the wafer may correspond to the upper surface of the bulk semiconductor layer 16 in FIG. 1. The wafer, for instance a silicon wafer, may be doped by suitable impurity atoms (dopants) to enhance the electrical conductivity of the semiconductor material of the bulk semiconductor layer 16. By way of example, the wafer may be doped to obtain a n+ doped bulk silicon layer 16 of high electrical conductivity.

Still during frontend wafer processing, an epitaxial layer 15 may be generated on the upper surface of the wafer. All epitaxial techniques known to a person skilled in the art may be used, e.g., MBE (molecular beam epitaxy), LPE (liquid phase epitaxy) etc. The epitaxial layer 15 is designed to contain a sequence of p-n junctions to form the active semiconductor region of the vertical power device.

The first contact pad(s) 11 are formed on the upper surface 12 of the epitaxial layer 15. This step may still be carried out during wafer processing, that is during frontend processing. In other embodiments, the first contact pad(s) 11 may be formed on the single power semiconductor chips 10 after separation of the wafer into multiple power semiconductor chips 10.

Similar to the first contact pad(s) 11, the second contact pad(s) 13 are formed either during wafer processing on the intact wafer or on the power semiconductor chips 10 singularized from the wafer.

The integrated power circuits and possibly further integrated circuits can be electrically accessed via the contact pads 11, 13. The contact pads 11, 13 may be made of a metal, for example, aluminum or copper, and may have any desired shape and size.

The power semiconductor chip 10 may be mounted on the upper surface of the carrier 20. A connecting layer 17 of solder material, e.g., a diffusion solder material comprising e.g. AuSn and/or other metal materials may be used to electrically connect and mechanically secure the second contact pad(s) 13 to the carrier 20.

The carrier 20 may be of various types. In one embodiment the carrier 20 may be a patterned metal sheet or plate, e.g., a leadframe. The carrier 20 may comprise metal plate regions which are separated from each other by spacings. In another embodiment the carrier 20 may be a continuous, unpatterned metal plate or sheet. The carrier 20 may be produced by a stamping and/or milling process. The metal of which the carrier is made may, e.g., comprise one or more metals of the group of copper, aluminum, nickel, gold or any alloy based on one or more of these metals. The carrier (e.g., leadframe) may be made of one single bulk metal layer or a multi metal layer structure. The carrier 20 may serve as a heat sink for dissipating the heat generated by the power semiconductor chip 10.

D1 is the distance between the carrier 20 and the epitaxial layer 15, that is the distance between the upper surface of the carrier 20 and the beginning of the epitaxial layer 15 (in the example shown in FIG. 1 the beginning of the epitaxial layer 15 is the transition between the bulk silicon layer 16 and the epitaxial layer 15). The distance D1 is a parameter which has a strong influence on the degree of stress which is exercised on the epitaxial layer 15 of the power semiconductor chip 10 by the carrier 20. Typically, the CTE of the carrier 20 and the CTE of the semiconductor chip 10 are significantly different. Generally, the CTE of the carrier 20 may be greater than the CTE of the power semiconductor chip 10 by a factor of, e.g., 5, 6, 7, 8, 9, 10 or even more. By way of example, a power semiconductor chip 10 made of silicon has a CTE of about 2.5 ppm, whereas the CTE of a typical leadframe made of copper is about 18 ppm. Thus, after soldering, as the contraction of the carrier 20 is considerably greater than the contraction of the power semiconductor chip 10, the carrier 20 (e.g., leadframe) exerts high tensile stress on the power semiconductor chip 10.

Figure 2:
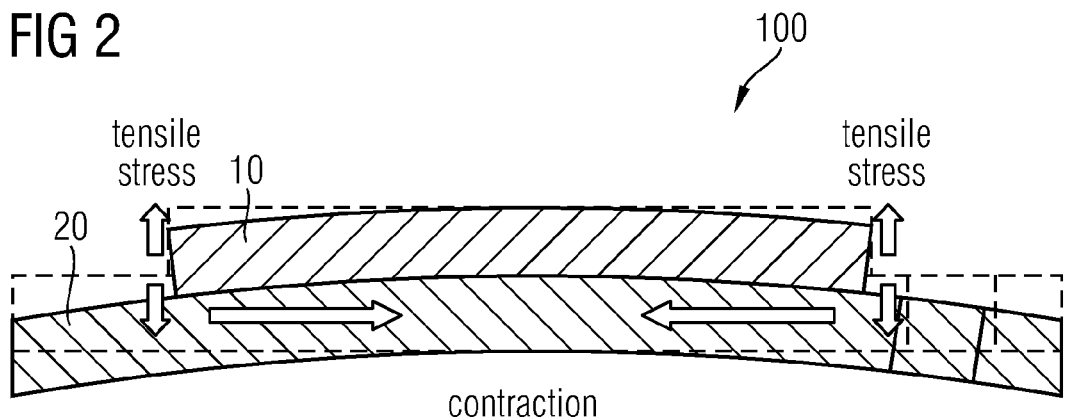
FIG. 2 is a simplified illustration of the power semiconductor device of FIG. 1 showing the tensile stress applied on the power semiconductor chip by the carrier.

This is illustrated in FIG. 2 showing the semiconductor device 100 in simplification. The contraction of the carrier 20 is indicated by the arrows "contraction". The tensile stress exerted on the power semiconductor chip 10 is indicated by arrows "tensile stress". As is apparent in FIG. 2, the tensile stress acts in a vertical direction on the peripheral region of the power semiconductor chip 10, that is in a direction which is substantially perpendicular to the extension of the carrier 20 running in a horizontal direction. The tensile stress is accompanied by warpage, i.e., the semiconductor device 100 is forced into a bowed or convex shape. In FIG. 2, the curvature of the power semiconductor chip 10 and the carrier 20 is exaggerated for the sake of illustration. Further, dashed lines correspond to the straight-lined extension of the power semiconductor chip 10 and the carrier 20 before soldering.

The shorter the distance D1, the greater is the tensile stress acting on the power semiconductor chip 10. According to one embodiment, it has been found that high tensile stress acting on the epitaxial layer 15 improves the electrical properties of the power semiconductor chip 10. In particular, the on-state resistance (Ron) of the power semiconductor chip 10 is significantly reduced by enhancing the external tensile stress acting on the epitaxial layer 15 of the power semiconductor chip 10.

In other words, tensile stress is selectively introduced into the epitaxial layer 15 of the power semiconductor chip 10 by designing D1=50 μm. Further, smaller dimensions such as D1=40 μm or 30 μm or 20 μm or even 10 μm may be used. This is in contrast to the conventional approach, where large dimensions of D1 are used in order to compensate for the different CTEs and thus to decrease the tensile stress acting on the power semiconductor chip 10.

The tensile stress acting on the epitaxial layer 15 can be enhanced by using a connecting layer 17 made of brittle solder materials such as, e.g., solder materials on the basis of AuSn. AuSn has a high elastic modulus of about 59,000 MPa. Other lead-free solder materials may also be used. This is in contrast to the conventional approach, where deformable or elastic bonding materials such as electrically conductive adhesives or solder materials based on Pb are used in order to compensate for the different CTEs and thus to decrease the tensile stress acting on the semiconductor chip 10.

The tensile stress acting on the epitaxial layer 15 can be enhanced by using a thin connecting layer 17 of solder material. For instance, the connecting layer 17 of solder material may be as thin as or thinner than 10 μm, 5 μm, 2 μm or even 1 μm. Further, the second contact pad 13 may have a thickness of equal or less than 2 μm or even 1 μm. This is in contrast to the conventional approach, where connecting layers of substantial thickness are used in order to compensate for the different CTEs and thus to decrease the tensile stress acting on the power semiconductor chip 10.

The tensile stress acting on the epitaxial layer 15 of the power semiconductor chip 10 can be enhanced by using diffusion solder materials. Diffusion solder materials such as, e.g., AuSn, CuSn, AgSn can have intermetallic phases formed of at least two solder components. The first of the solder components has a melting point which is lower than the melting point of the intermetallic phases, and the second of the solder components has a melting point which is higher than the melting point of the intermetallic phases. In addition, in its diffusion region, the diffusion solder may include nanoparticles of a filler material, which can prevent the formation of microcracks originating from the intermetallic phases in the event of thermomechanical loading. Connections produced by diffusion solder materials are brittle, may have a high elastic modulus as mentioned above and may be as thin as mentioned above. Thus, lead-free diffusion solder connections for the connecting layer 17 are highly suitable to effectively apply the tensile stress produced by the carrier 20 to the power semiconductor chip 10.

The tensile stress acting on epitaxial layer 15 can be enhanced by using a thin bulk semiconductor layer 16. For instance, in one embodiment, the bulk semiconductor layer 16 may be as thin as or thinner than 30 μm, in particular, 20 μm, 15 μm or even 10 μm. This may be achieved by thinning the wafer at its bottom side to generate a common planar wafer surface comprising the second main face 14 of the power semiconductor chip 10. Thinning may be accomplished, e.g., by grinding or lapping. Whilst grinding tools use an abrasive wheel, lapping tools use a fluid ("slurry") charged with "rolling" abrasive particles acting between two surfaces. For instance, CMP (chemical mechanical polishing) may be applied. As the bulk semiconductor layer 16 has no influence on the performance of the semiconductor device 100 (it simply provides a highly conductive junction to the second contact pad 13), the thinning of the wafer may be continued until a minimum grinding thickness tolerance is reached. In one embodiment, the bulk semiconductor layer 16 may be as thin as or thinner than 10 μm, 5 μm or even 2 μm. This may be achieved by etching the wafer at its bottom side to generate a common planar wafer surface comprising the second main face 14 of the power semiconductor chip 10. As the bulk semiconductor layer 16 has no operational effect on the performance of the semiconductor device 100 (except of providing a highly conductive junction to the second contact pad 13), the etching of the wafer may be continued until a minimum etching thickness tolerance is reached.

Using one or more of these methods, the tensile stress acting on the epitaxial layer 15 can be set to about hundreds of MPa, e.g., to more than 200 MPa, 500 MPa, or even 1000 MPa. Even a tensile stress as high as one or a multiple of GPa may be obtained. It is to be noted that the tensile stress must not exceed the tensile breaking stress, which is, e.g., about 5 GPa for a typical silicon power chip having an operating voltage of about 500 V.

It is to be noted that other design parameters may be used to adjust the degree of tensile stress applied to the epitaxial layer 15. By way of example, the thickness Dcar of the carrier 20 may have some effect on tensile stress loading. According to one aspect, a ratio of the thickness Dcar of the electrically conducting carrier 20 and a sum of the thickness Dchip of the power semiconductor chip 10, the thickness Dpad of the second contact pad 13 and the thickness Dcon of the connecting layer 17 is equal or greater than 3, i.e., $$D\text{car}/(D\text{chip}+D\text{pad}+D\text{con})=3. \quad (1)$$

This ratio may even be equal or greater than 5, in particular 7, more in particular 10. The greater the thickness Dcar of the carrier 20 the more efficient is the transport of heat out of the semiconductor device 100.

Figure 3:
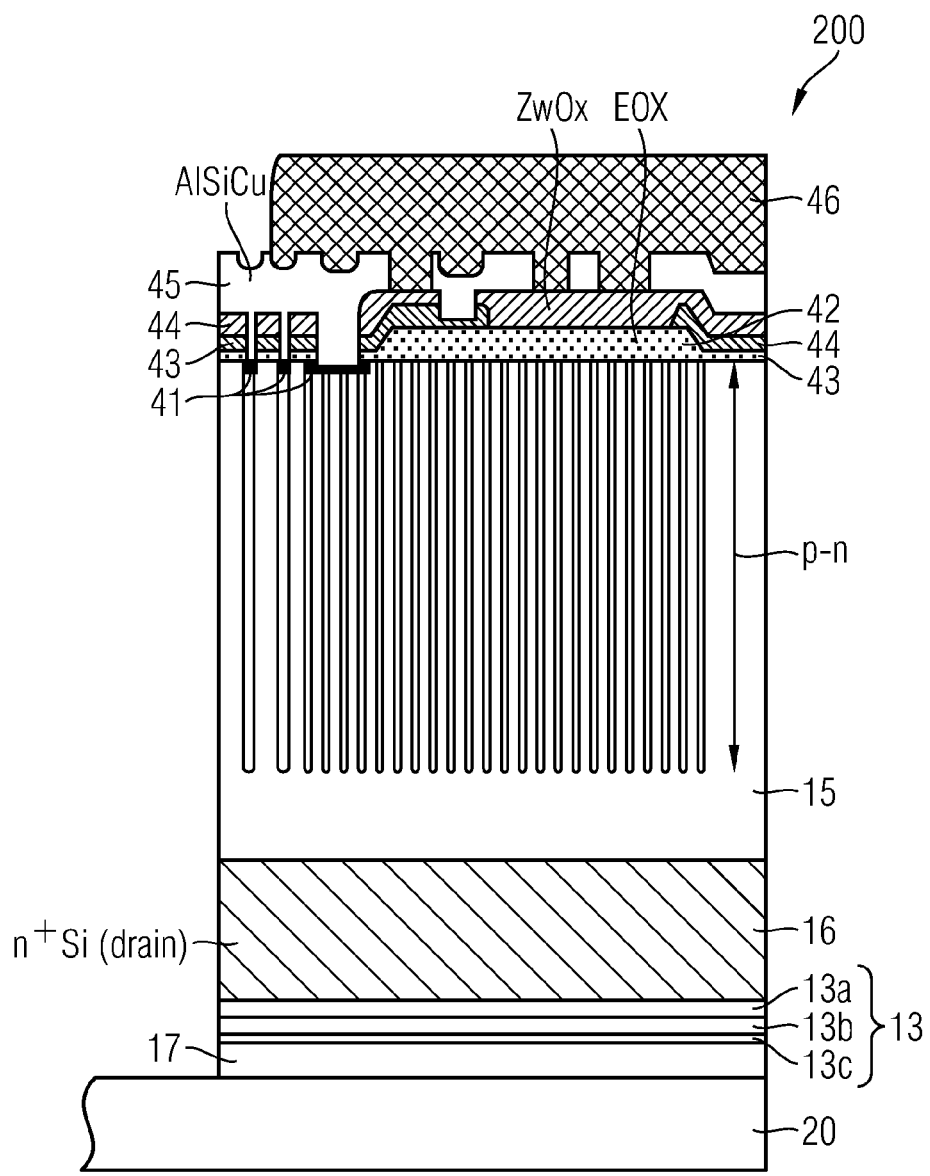
FIG. 3 is a cross-sectional view of one detailed embodiment in accordance with the embodiment shown in FIG. 1.

FIG. 3 is a cross-sectional view of one detailed, exemplary embodiment in accordance with the embodiment shown in FIG. 1. The semiconductor device 200 shown in FIG. 3 is a power MOSFET having an operating voltage of 600 V. Carrier 20 is a leadframe made of copper having, for instance, a thickness Dcar=1.3 mm. In general, Dcar may be equal or greater than 1.0 mm or even 2.0 mm. The connecting layer 17 is made of an AuSn diffusion solder and has a thickness of 1.2 μm. The second contact pad 13 comprises a lower pad layer 13a made of aluminum (Al), an upper pad layer 13b following the lower pad layer 13a and made of titanium (Ti) and a coating layer 13c following the upper pad layer 13b and made of nickel vanadium (NiV). These second contact pad layers 13a, 13b, 13c may, for example, have thicknesses of about 400 nm (Al layer), 400 nm (Ti layer) and 75 nm (NiV layer). Thus, the total thickness Dcon+Dpad of the connecting layer 17 and the second contact pad 13 is about as small as 2.075 μm. This thickness Dcon+Dpad could also easily be reduced to be equal or smaller than 2.0 μm, if desired.

Further to FIG. 3, the bulk semiconductor layer 16 may be made of n+ doped silicon and may have a thickness Dbulk (see FIG. 1) of about 17.5 μm. This thickness can be obtained by wafer grinding. The doped bulk semiconductor layer 16 may behave essentially as a metal. The degenerate semiconductor-metal junction between the bulk semiconductor layer 16 and the lower pad layer 13a of the second contact pad 13 also has a high electrical conductivity. The bulk semiconductor layer 16 and the second contact pad 13 represent the drain terminal of the power MOSFET.

The epitaxial layer 15 represents the active region of the power semiconductor chip 10. In this example it has a thickness Depi (see FIG. 1) of 52.5 μm, allowing for an operating voltage of about 600 V. The epitaxial layer 15 comprises a series of p-n junctions which are located within a region of the epitaxial layer indicated by arrow p-n in FIG. 3. In general, the epitaxial layer 15 may have a thickness of equal or greater than 20 μm, in particular, equal or greater than 30 μm, still, in particular, equal or greater 40 μm or, in particular, equal or greater than 50 μm. As a rule of thumb, each 100 V of operating voltage may need about 9 μm of epitaxial layer thickness. Thus, the vertical power semiconductor chip 10 may have an operating voltage of equal or greater than 200 V, in particular equal or greater than 300 V, still in particular equal or greater than 400 V or in particular equal or greater than 500 V.

A highly conductive plug 41 is provided within the epitaxial layer 15. The highly conductive plug 41 is electrically connected to the p-n junctions of the epitaxial layer 15 to form a source contact thereof.

The conductive plug 41 is covered by a first insulating layer 42 such as, e.g., an oxide layer, which is provided on top of the epitaxial layer 15. The insulating layer 42 is referred to as EOX in FIG. 3 and is configured to have openings through which the conductive plug 41 may be accessed.

A first structured metal layer 43 may be arranged over the insulating layer 42. The first structured metal layer 43 may serve to provide an electrical functionality such as, e.g., electrostatic shielding of the power MOSFET. Further, additional structured metal layers not shown in the sectional view of FIG. 3 may be arranged in the vicinity of the upper face 12 of the epitaxial layer 15, e.g., structured metal layers to provide for additional connectivity and/or signal routing such as, e.g., a structured metal layer to form a gate contact of the p-n junctions of the epitaxial layer 15.

A second structured insulating layer 44 such as, e.g., an oxide layer may be arranged over the first structured metal layer 43. The second insulating layer 44 is referred to as ZwOX in FIG. 3 configured to have openings through which the conductive plug 41 may be electrically contacted by a second metal layer 45. The second metal layer 45 may, for instance, be made of AlSiCu and may represent the source terminal of the power MOSFET. Further, a polymer layer 46 may be provided to cover the second metal layer 45. A polymer material such as parylene, photoresist material, imide, epoxy, duroplast or silicone may be used.

By way of example, the layers 42, 43, 44, 45 and 46 may have the following dimensions in thickness. The first insulating layer 42 may have a thickness Dins1 of 2.4 μm, the second insulating layer 44 may have a thickness Dins2 of 1.5 μm, the first metal layer 43 may have a thickness Dmet of 5.0 μm and the polymer layer 46 may have a thickness Dpoly of 6.0 μm. It is to be noted that the dimensions, materials and the provision of these layers are exemplary and are subject to variations in accordance with the needs of the semiconductor design.

Figure 4:
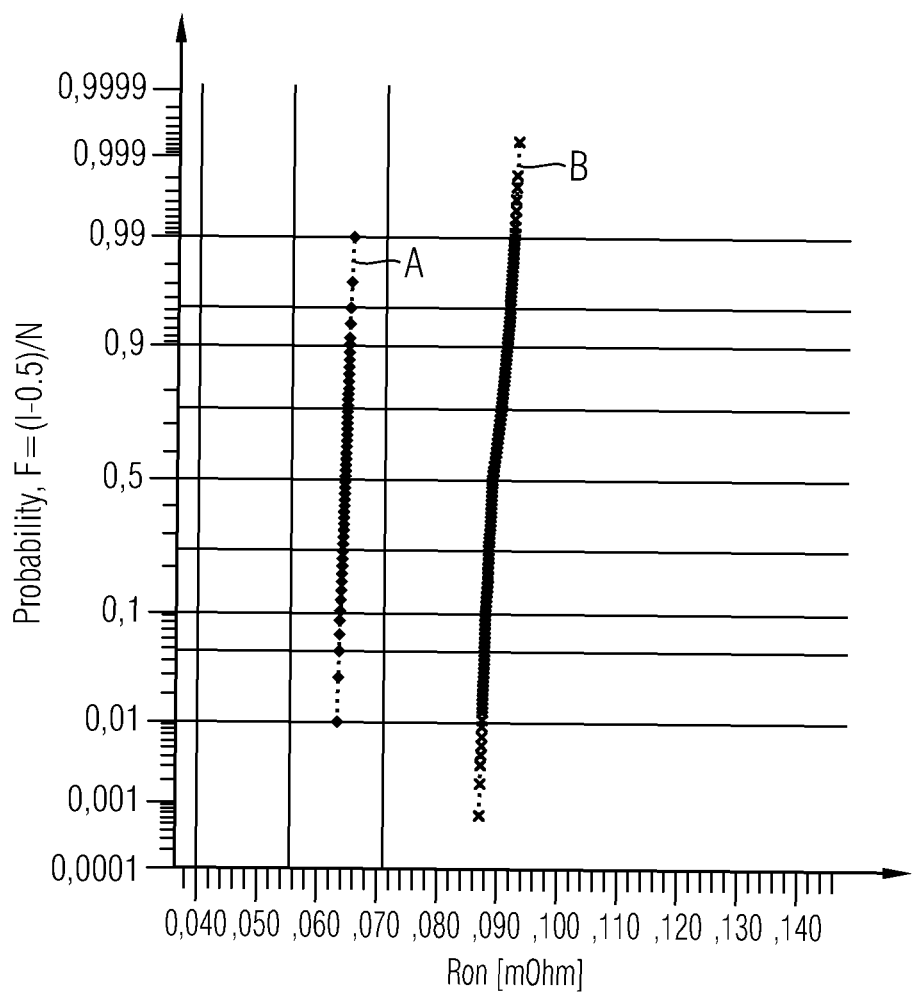
FIG. 4 is a diagram illustrating the probability distribution of on resistance for an ensemble of identical power semiconductor chips mounted in a stress loaded condition on a carrier as shown in FIG. 3 and for an ensemble of identical power semiconductor chips operated in the absence of external tensile stress.

FIG. 4 is a diagram illustrating the probability distribution of Ron for an ensemble of N identical power semiconductor chips 10 mounted on a carrier (leadframe) 20 as shown in FIG. 3 and for an ensemble of N identical power semiconductor chips 10 operated in the absence of tensile stress. The x-axis displays Ron in units of mOhm while the y-axis is the probability ranging from 0 to 1 drawn in a logarithmic scale. FIG. 4 illustrates that Ron is significantly different for stress loaded power semiconductor chips 10 (measurement results show up along line A) and power semiconductor chips 10 in a condition free of external stress (measurement results show up along line B). While in a condition free of external stress, an average value of Ron=90 mOhm is obtained, the application of external stress reduces the on-state resistance Ron to an average value of Ron=65 mOhm. Thus, in this example, a mean reduction of Ron of 38% in relation to the target value of 65 mOhm may be reached by the application of external tensile stress. In other words, the application of external stress on the p-n junctions in the epitaxial layer 15 significantly increases the charge carrier mobility in the epitaxial layer 15. It is to be noted that FIG. 4 further demonstrates that the standard deviation of Ron within each ensemble is small compared to the difference between the respective mean values of Ron. Thus, both the formation of the external tensile stress by virtue of the mechanical measures and methods explained herein and the effect of the external tensile stress on the electrical performance of the power semiconductor chips 10 are clearly systematic and highly reproducible results.

Figure 5:
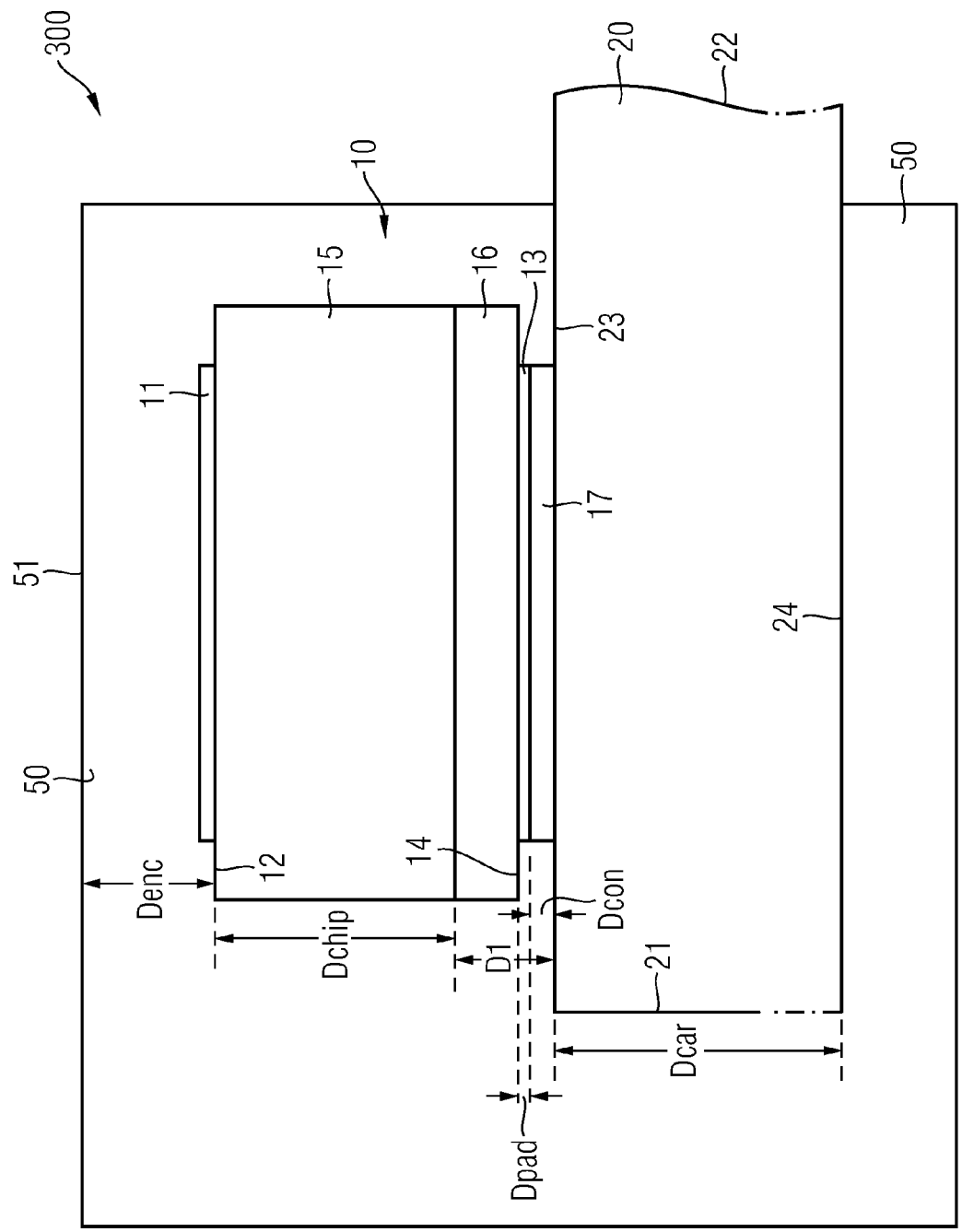
FIG. 5 is a cross-sectional view of one embodiment comprising the semiconductor device of FIG. 1 encapsulated in an encapsulation body embedding the power semiconductor chip.

FIG. 5 schematically illustrates a cross-sectional view of a semiconductor device 300 of one embodiment comprising the semiconductor device 100 of FIG. 1 encapsulated in an encapsulation body 50 embedding the power semiconductor chip 10. The encapsulation body 50 may also partly or completely embed the carrier 20. By way of example, in the semiconductor device 300 shown in FIG. 5, the carrier 20 protrudes at one side face 22 from the encapsulation body 50 and is covered at the other side faces 21, the upper face 23 and the lower face 24 opposite to the upper face 23 by the encapsulation body 50.

Figure 6:
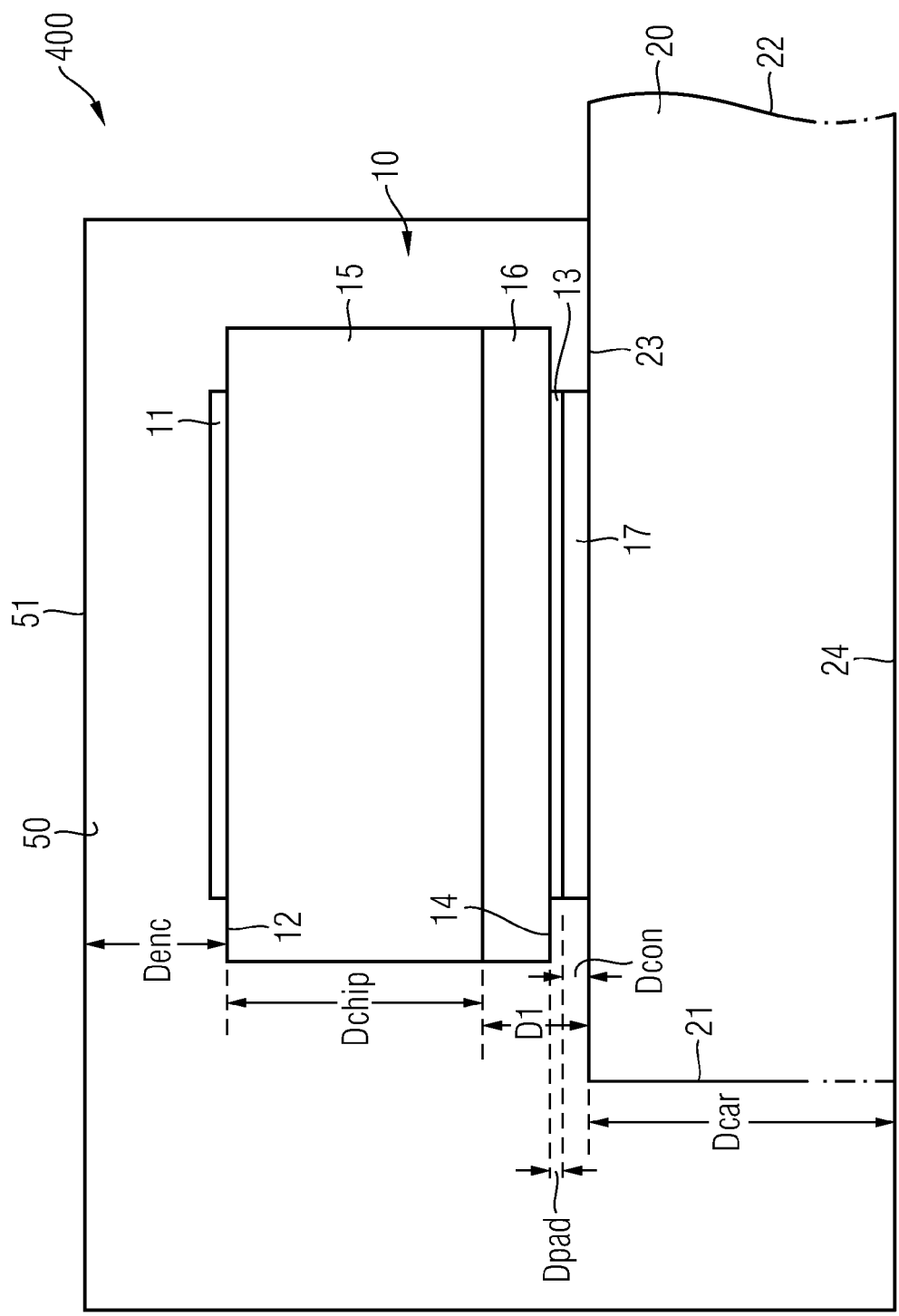
FIG. 6 is a cross-sectional view of one embodiment comprising the semiconductor device of FIG. 1 encapsulated in an encapsulation body embedding the power semiconductor chip and the carrier.

FIG. 6 illustrates a cross-sectional view of a semiconductor device 400 according to one embodiment. The semiconductor device 400 is similar to the semiconductor device 300 of FIG. 5 except that the lower face 24 of the carrier 20 remains exposed (i.e. uncovered by the encapsulation body 50).

The encapsulation body 50 may be made of any appropriate duroplastic, thermoplastic or thermosetting (matrix) material or laminate, for example, a prepreg (short for preimpregnated fibers). In particular, a (matrix) material based on epoxy resin may be used. The dielectric (matrix) material which forms the encapsulation body 50 may contain a filler material. By way of example, the filler material may consisting of small particles of glass ($SiO_2$) or other electrically insulating mineral filler materials like $Al_2O_3$ or organic filler materials. After its deposition, the dielectric material may be only partially hardened and may be completely hardened by the application of energy (e.g., heat, UV light, etc.) to form the encapsulation body 50.

Various techniques may be employed to form the encapsulation body 50 by the dielectric material, for example, compression molding, transfer molding, injection molding, powder molding, liquid molding, dispensing or laminating. For example, compression molding may be used. In compression molding, a liquid molding material is dispensed into an open lower mold half in which the carrier 20 and the power semiconductor chip 10 mounted thereon are placed. Then, after dispensing the liquid molding material, an upper mold half is moved down and spreads out the liquid molding material until a cavity formed between the lower mold half and the upper mold half is completely filled. This process may be accompanied by the application of heat and pressure.

Figure 7:
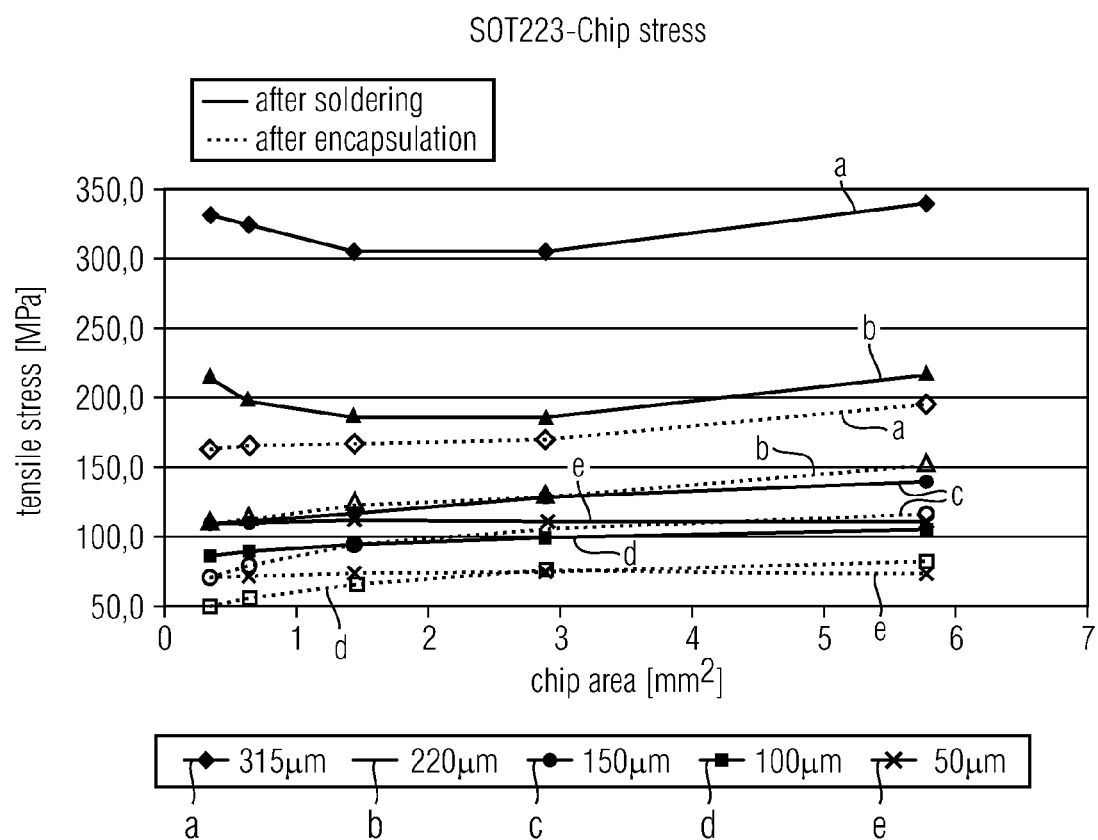
FIG. 7 is a diagram illustrating the tensile stress in units of MPa versus the chip area in units of mm$^2$ for power semiconductor chips of various thicknesses.

FIG. 7 is a diagram illustrating the tensile stress in units of MPa versus the chip area in units of $mm^2$ for power semiconductor chips of various thickness of 50, 100, 150, 220 and 315 μm after soldering (solid lines) and after encapsulation (dashed lines). As a first result, it is found that the tensile stress is only slightly dependent on the chip area. Thus, semiconductor chips of all sizes are believed to take benefit of the principles explained above. As a second result, the tensile stress significantly enhances with increasing chip thickness. Thus, the thicker the power semiconductor chip, the more pronounced is the electrical effect (increase of the charge carrier mobility) induced by the application of external stress. Further, as a third result, FIG. 7 indicates that the tensile stress may be significantly reduced by encapsulation. This aspect is regarded below in more detail.

According to another aspect, the encapsulation body 50 may be used to apply stress to the epitaxial layer 15 of the power semiconductor chip 10. To this end, the encapsulation material of the encapsulation body 50 may have an elastic modulus of equal or greater than 50,000 MPa.

By using an encapsulation body 50 made of an encapsulation material having an elastic modulus of equal or greater than 50,000 MPa, the stress acting on the power semiconductor chip 10 is significantly affected or even dominated by the encapsulation body 50 rather than by the carrier 20.

Figure 8:
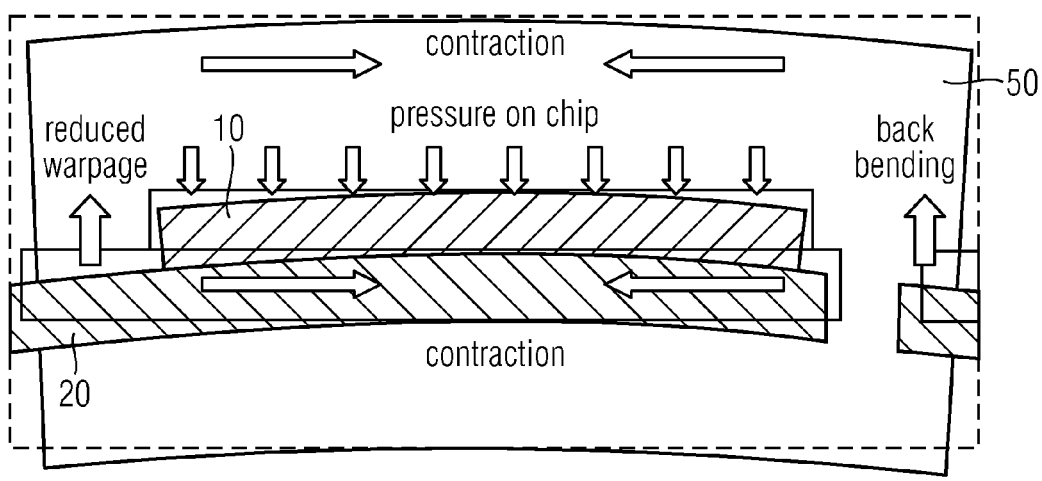
FIG. 8 is an illustration of the semiconductor device of FIG. 2 encapsulated in an encapsulation body 50, showing a relieve of tensile stress and an enhancement of downward pressure applied on the upper main face of the power semiconductor chip due to an encapsulation process.

FIG. 8 illustrates the forces acting in semiconductor devices such as, e.g., device 300 of FIG. 5 when the semiconductor chip 10 is encapsulated in an encapsulation body 50. FIG. 8 illustrates a relieve of tensile stress and an enhancement of downward pressure acting on the power semiconductor chip 10 due to the encapsulation process. More specifically, as indicated in FIG. 8, the warpage of the power semiconductor chip 10 due to the contraction of the carrier 20 after soldering is counteracted by and, that way, reduced by the contraction of the encapsulation body 50 during hardening. Simultaneously, the contraction of the encapsulation body 50 during hardening causes the encapsulation body 50 to generate a downward pressure on the upper main face 12 of the power semiconductor chip 10. Both effects (reduction of warpage and tensile stress and enhancement of downward pressure) are strongly dependent on the elastic modulus of the encapsulation material of the encapsulation body 50. The greater the elastic modulus of the encapsulation material of the encapsulation body 50, the greater is the reduction of warpage and tensile stress and the enhancement of downward pressure applied by the (cured) encapsulation material on the upper main chip face 12 of the power semiconductor chip 10. In general, the elastic modulus of the encapsulation material may even be equal or greater than 60,000 MPa, in particular, equal or greater than 70,000 MPa, or equal or greater than 80,000 MPa. This may be achieved by adding a filler material to the encapsulation material, the percentage of filler material in the encapsulation material may be equal or greater than 80 vol %, in particular, equal or greater than 85 vol %. The same principles as exemplified in FIG. 8 apply to semiconductor device 400 shown in FIG. 6.

Briefly put, the encapsulation body 50 converts tensile stress into downward pressure, with the conversion efficiency increases with the elastic modulus of the encapsulation material. It has been found that the application of external pressure on the upper main face 12 of the power semiconductor chip 10 reduces the on-state resistance Ron to significantly lower values compared to the Ron values associated with the same warpage (which is a measure of the tensile stress for a given chip thickness) but lower external pressure on the upper main face 12 of the power semiconductor chip 10. Thus, the provision of an encapsulation material made of an elastic modulus of equal or greater than 50,000 MPa allows to reduce the warpage (and thus the tensile stress) and may simultaneously improve the electrical performance of the power semiconductor chip 10.

Figure 9:
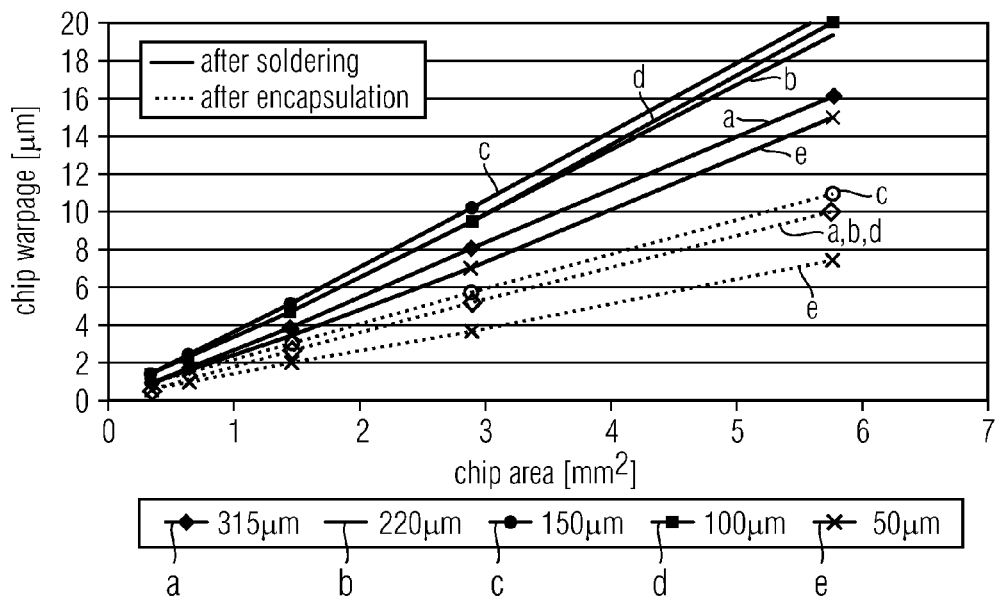
FIG. 9 is a diagram illustrating the chip warpage in units of μm versus the chip area in units of mm$^2$ for power semiconductor chips of various thicknesses.

FIG. 9 is a diagram illustrating the chip warpage in units of μm versus the chip area in units of $mm^2$ for power semiconductor chips of various thicknesses of 50 μm, 100 μm, 150 μm, 220 μm and 315 μm. Solid lines correspond to chip warpage after soldering, whilst dashed lines correspond to (reduced) chip warpage after encapsulation. It is to be noted that the chip warpage is reduced by encapsulation for all chip areas. The reduction of chip warpage after encapsulation increases with chip area. Further, the chip warpage slightly reduces with chip thickness. Note that the external tensile stress acting on the power semiconductor chip 10 is solely dependent on the warpage for a given chip thickness.

Table 1 relates to a semiconductor device referred to as package P-SOT223-4 having a design similar to the design of the semiconductor device or package 200 shown in FIG. 3. Thus, to avoid reiteration, reference is made to the semiconductor device 200.

TABLE 1

Mechanical properties of package materials
Package P-SOT223-4

| Part | Material | E-Modulus | CTE |
|---|---|---|---|
| Encapsulation body | KMC 180-7 | 13,000 MPa | 13 ppm |
| Leadframe | C18070/K75 | 138,000 MPa | 18 ppm |
| Leadframe plating | Ag | 79,000 MPa | 19.7 ppm |
| Connecting layer | AuSn 80/20 | 59,000 MPa | 15.4 ppm |
| Upper pad layer | Ti | 110,000 MPa | 9 ppm |
| Lower pad layer | Al | 71,000 MPa | 23.8 ppm |
| Coating layer | Au | 78,000 MPa | 14.3 ppm |
| Semiconductor chip | Silicon | 168,00 MPa | 2.5 ppm |

As indicated in Table 1, the encapsulation material of the encapsulation body 50 may have an elastic modulus of about 13,000 MPa. This is a typical elastic modulus value of an encapsulation material commonly used in the art. As this value is comparatively small in relation to the elastic moduli of the other parts of the package (see Table 1), the contribution of the encapsulation body to the forces acting on the power semiconductor chip may be small. Therefore, high warpage and high tensile stress may be obtained. On the other hand, according to the aspect explained above, the elastic modulus of the encapsulation material of the encapsulation body 50 may be set as high as about 50,000 MPa or more, e.g., by the addition of a filler material or by the replacement of the encapsulation material KMC 180-7 (see Table 1) by an encapsulation material having such high elastic modulus. In this case, the warpage and the tensile stress are reduced (see FIG. 9). However, a low value of Ron is still maintained or even lowered by virtue of the enhanced application of downward pressure on the upper main face 12 of the power semiconductor chip 10 as explained above.

The concept of using an encapsulation body 50 made of an encapsulation material having an elastic modulus of equal or greater than 50,000 MPa can be combined with all methods and measures mentioned herein in conjunction with other embodiments. In particular, a connecting layer 17 made of a brittle solder material such as, e.g., a solder material on the basis of AuSn could be used. A diffusion solder material, e.g., on the basis of AuSn can be used and may have a high elastic modulus of about 59,000 MPa (see Table 1).

By way of example, package P-SOT223-4 exemplified in Table 1 uses an encapsulation body 50 having a thickness of 1 mm over the carrier 20, wherein the carrier 20 is a silver plated copper leadframe having a thickness of 250 μm. Employing an encapsulation body 50 made of an encapsulation material having an elastic modulus of equal or greater than 50,000 MPa considerably reduces the warpage of the package while simultaneously allowing for low values of Ron. Thus, the application of an encapsulation material having such high elastic modulus could help to limit the warpage while simultaneously improving (or at least not adversely affecting) the low Ron characteristic.

In some embodiments, see, e.g., FIG. 5 or 6, a ratio of a distance Denc between an upper surface 12 of the power semiconductor chip 10 and an upper surface 51 of the encapsulation body 50 and a sum of the thickness Dchip of the power semiconductor chip 10, the thickness Dpad of the second contact pad 13, the thickness Dcon of the connecting layer 17 and the thickness Dcar of the electrically conducting carrier 20 is equal or greater than 3, i.e., $$D\text{enc}/(D\text{chip}+D\text{pad}+D\text{con}+D\text{car})=3. \quad (2)$$

This ratio may even be equal or greater than 5, in particular 6, more in particular 7.

If condition (2) is satisfied, typically, a substantial amount of tensile stress is converted into compression (that is downward pressure) acting on the power semiconductor chip 10. The beneficial effect of this conversion on Ron has already been explained in conjunction with the aforementioned embodiment. Different to the aforementioned embodiment, where the effect is mainly induced by the high elastic modulus of the encapsulation material, the effect is here mainly caused by geometrical design constraints according to condition (2), e.g., by a substantial thickness Denc of the encapsulation body 50 over the upper face 12 of the power semiconductor chip 10. It is to be noted that in the art, the ratio defined in condition (2) is always considerably smaller than 3 to the best knowledge of the inventor.

Of course, both methods explained above to efficiently convert external tensile stress into external downward pressure can be combined, that is an encapsulation body 50 dimensioned to satisfy the condition (2) and made of an encapsulation material having a high elastic modulus (e.g. elastic modulus=50,000 MPa or more) can be used in combination.

In one embodiment of a method of manufacturing a semiconductor device, first, a vertical power semiconductor chip 10 having an epitaxial layer 15 and a bulk semiconductor layer 16 is provided. The power semiconductor chip 10 has a first contact pad 11 arranged on a first main face 12 of the power semiconductor chip 10 and a second contact pad 13 arranged on a second main face 14 of the power semiconductor chip 10 opposite to the first main face 12.

Then, the vertical power semiconductor chip 10 is mounted on the electrically conducting carrier 20 which is thereby attached to the second contact pad 13. As mentioned above, the distance between the electrically conducting carrier 20 and the epitaxial layer 15 may be less than 50 μm, and/or condition (1) may be satisfied.

Further, the power semiconductor chip 10 and, optionally, the carrier 20 may be embedded in an encapsulation material forming an encapsulation body 50. Encapsulation may, e.g., be accomplished by a molding, dispensing or laminating technique.

The encapsulating material may have a low elastic modulus or may not satisfy condition (2). In these cases, the encapsulation material may not significantly affect or dominate the forces acting on the power semiconductor chip 10. On the other hand, as mentioned above, the encapsulation material may have an elastic modulus of equal or greater than 50,000 MPa and/or condition (2) may be satisfied. In this case, the chip warpage is reduced and tensile stress is efficiently converted into downward chip pressure applied by the encapsulating body 50 on the epitaxial layer 15 of the power semiconductor chip 10.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a vertical power semiconductor chip having an epitaxial layer and a bulk semiconductor layer,
   a first contact pad arranged on a first main face of the power semiconductor chip,
   a second contact pad arranged on a second main face of the power semiconductor chip, the second main face opposite to the first main face, and
   an electrically conducting carrier attached to the second contact pad, wherein a distance between the electrically conducting carrier and the epitaxial layer is equal or less than 50 μm.

2. The device of claim 1, further comprising:
   a connecting layer located between the second contact pad and the electrically conducting carrier, wherein the connecting layer has a thickness of equal or less than 10 μm.

3. The device of claim 2, wherein the connecting layer comprises a diffusion solder material.

4. The device of claim 1, wherein the bulk semiconductor layer has a thickness of equal or less than 30 μm.

5. The device of claim 1, wherein the epitaxial layer has a thickness of equal or greater than 20 μm.

6. The device of claim 1, wherein the power semiconductor chip is a vertical power transistor having an operating voltage of equal or greater than 200 V.

7. A device, comprising:
   a vertical power semiconductor chip having an epitaxial layer and a bulk semiconductor layer,
   a first contact pad arranged on a first main face of the power semiconductor chip,
   a second contact pad arranged on a second main face of the power semiconductor chip opposite to the first main face,
   an electrically conducting carrier, and
   a connecting layer located between the second contact pad and the electrically conducting carrier, wherein a ratio of the thickness of the electrically conducting carrier and a sum of the thickness of the power semiconductor chip, the thickness of the second contact pad and the thickness of the connecting layer is equal or greater than 3.

8. The device of claim 7, wherein the ratio is equal or greater than 5.

9. The device of claim 7, wherein the connecting layer has a thickness of equal or less than 10 μm.

10. The device of claim 7, wherein the electrically conducting carrier has a thickness of equal or greater than 1.0 mm.

11. The device of claim 7, wherein the power semiconductor chip is a vertical power transistor having an operating voltage of equal or greater than 200 V.

12. A device, comprising:
   a vertical power semiconductor chip having an epitaxial layer and a bulk semiconductor layer,
   a first contact pad arranged on a first main face of the power semiconductor chip,
   a second contact pad arranged on a second main face of the power semiconductor chip opposite to the first main face,
   an electrically conducting carrier, and
   an encapsulation body comprising an encapsulation material covering the power semiconductor chip, wherein the encapsulation material has an elastic modulus of equal or greater than 50,000 MPa.

13. The device of claim 12, wherein the elastic modulus of the encapsulation material is equal or greater than 60,000 MPa.

14. The device of claim 12, further comprising:
   a connecting layer located between the second contact pad and the electrically conducting carrier, wherein the elastic modulus of the material of the connecting layer is equal or greater than 50,000 MPa.

15. The device of claim 12, wherein the encapsulation material comprises a filler material, the percentage of filler material in the encapsulation material is equal or greater than 80 vol %.

16. The device of claim 12, wherein the power semiconductor chip is a vertical power transistor having an operating voltage of equal or greater than 200 V.

17. A device, comprising:
   a vertical power semiconductor chip having an epitaxial layer and a bulk semiconductor layer,
   a first contact pad arranged on a first main face of the power semiconductor chip,
   a second contact pad arranged on a second main face of the power semiconductor chip opposite to the first main face,
   an electrically conducting carrier,
   a connecting layer located between the second contact pad and the electrically conducting carrier, and
   an encapsulation body comprising an encapsulation material covering the power semiconductor chip, wherein a ratio of a distance between an upper surface of the power semiconductor chip and an upper surface of the encapsulation body and a sum of the thickness of the power semiconductor chip, the thickness of the second contact pad, the thickness of the connecting layer and the thickness of the electrically conducting carrier is equal or greater than 3.

18. The device of claim 17, wherein the ratio is equal or greater than 5.

* * * * *